United States Patent
Alfano et al.

(10) Patent No.: US 7,397,234 B2
(45) Date of Patent: Jul. 8, 2008

(54) CURRENT SENSOR WITH RESET CIRCUIT

(75) Inventors: Donald E. Alfano, Round Rock, TX (US); Timothy J. Dupuis, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 49 days.

(21) Appl. No.: 11/428,082

(22) Filed: Jun. 30, 2006

(65) Prior Publication Data

US 2007/0139835 A1      Jun. 21, 2007

Related U.S. Application Data

(63) Continuation-in-part of application No. 11/311,603, filed on Dec. 19, 2005.

(51) Int. Cl.
*G01R 1/20* (2006.01)
*G01R 15/18* (2006.01)

(52) U.S. Cl. ........................ 324/126; 324/127

(58) Field of Classification Search ............... 324/126, 324/127, 117 H, 117 R
See application file for complete search history.

(56) References Cited

U.S. PATENT DOCUMENTS

| | | | |
|---|---|---|---|
| 4,176,374 A * | 11/1979 | Eames .......................... | 348/263 |
| 4,536,706 A | 8/1985 | Kemper | |
| 4,691,338 A | 9/1987 | Makino | |
| 4,931,725 A | 6/1990 | Hutt et al. | |
| 5,015,945 A * | 5/1991 | Radun ........................... | 324/127 |
| 5,032,785 A | 7/1991 | Mathis et al. | |
| 5,070,317 A | 12/1991 | Bhagat | |
| 5,124,648 A | 6/1992 | Webb et al. | |
| 5,128,611 A | 7/1992 | Konrad | |
| 5,696,441 A | 12/1997 | Mak et al. | |
| 5,815,391 A | 9/1998 | Pelly | |
| 5,986,341 A | 11/1999 | Usami et al. | |
| 6,097,203 A | 8/2000 | Parker et al. | |
| 6,271,655 B1 | 8/2001 | Weber et al. | |
| 6,356,068 B1 | 3/2002 | Steiner et al. | |
| 6,384,478 B1 | 5/2002 | Pour | |
| 6,661,231 B1 | 12/2003 | Arai et al. | |
| 6,781,359 B2 | 8/2004 | Stauth et al. | |
| 6,791,341 B2 * | 9/2004 | Shenai et al. ............... | 324/654 |

(Continued)

FOREIGN PATENT DOCUMENTS

EP      1498916 A1     1/2005

(Continued)

OTHER PUBLICATIONS

"1- and 2-Axis Magnetic Sensors HMC1001/1002, HMC1021/1022," Honeywell Sensor Products Data Sheet, Rev. B, Apr. 2000, 15 pages.

(Continued)

*Primary Examiner*—Ha Tran Nguyen
*Assistant Examiner*—Roberto Velez
(74) *Attorney, Agent, or Firm*—Zagorin O'Brien Graham LLP (57) ABSTRACT

A current sensor includes an integrator for providing an output signal, responsive to a detected current, and a reset circuit. The reset circuit, responsive to a control signal, resets the integrator for a time period shorter than an assertion time of the supplied control signal.

10 Claims, 11 Drawing Sheets

U.S. PATENT DOCUMENTS

| | | | |
|---|---|---|---|
| 6,835,576 | B2 | 12/2004 | Matsuzaki et al. |
| 7,227,240 | B2 | 6/2007 | Knapp et al. |
| 7,239,123 | B2 * | 7/2007 | Rannow et al. ......... 324/117 R |
| 2003/0098505 | A1 | 5/2003 | Kimura et al. |
| 2004/0021218 | A1 | 2/2004 | Hayama et al. |
| 2005/0156587 | A1 | 7/2005 | Yakymyshyn et al. |
| 2007/0114651 | A1 | 5/2007 | Marimuthu et al. |

FOREIGN PATENT DOCUMENTS

| | | |
|---|---|---|
| WO | WO02082109 A1 | 10/2002 |

OTHER PUBLICATIONS

ACS704 Data Sheet, Allegro Microsystems, Inc., (date prior to Oct. 9, 2005 email listing reference) 2 pages.

ACS704ELC-015 Data Sheet, Allegro MicroSystems, Inc. Rev. 6, 2005, 19 pages.

"Battery Powered Current Sensor" *Ask the Engineer*, Honeywell Solid State Electronics Center, 2003, 1 page.

Friedrich, Andreas P., and Lemme, Helmuth, "The Universal Current Sensor," *Sensors* magazine, May 1, 2000, 12 pages.

Jalebi, Ehsan Abdi et al., Real Time Rotor Bar Current Measurements Using a Rogowski Coil Transmitted Using Wireless Technology, University of Cambridge White Paper, Aug. 9, 2003, 9 pages.

Jingsheng, Liao et al., "Studies of Rogowski Coil Current Transducer for Low Amplitude Current (100A) Measurement," *IEEE CCECE 2003 Canadian Conference on Electrical and Computer Engineering*, vol. 1, May 4-7, 2003, 5 pages.

Koon, William, "Current Sensing for Energy Metering," in *Conference Proceedings IIC-China/ESC-China 2002*, pp. 321-324, 2002.

"Magnetic Current Sensing," AN-209, Honeywell Solid State Electronics Center, Apr. 2000, 7 pages.

Ward, D. A. and Exon, J. La T., "Using Rogowski Coils for Transient Current Measurements," *Engineering Science and Education Journal*, Jun. 1993, 9 pages.

U.S. Appl. No. 11/311,603, filed Dec. 19, 2005, entitled, "Integrated Current Sensor," naming inventors Timothy J. Dupuis and John Pavelka.

U.S. Appl. No. 11/311,517, filed Dec. 19, 2005, entitled, "Integrated Current Sensor Package," naming inventors Timothy J. Dupuis and John Pavelka.

* cited by examiner

CURRENT SENSOR WITH RESET CIRCUIT

This application is a continuation-in-part of U.S. patent application Ser. No. 11/311,603, entitled "INTEGRATED CURRENT SENSOR," filed Dec. 19, 2005, the entire disclosure of which is hereby incorporated herein by reference in its entirety for all purposes. This application also relates to U.S. patent application Ser. No. 11/311,517, entitled "INTEGRATED CURRENT SENSOR PACKAGE," filed Dec. 19, 2005, which is incorporated herein by reference.

BACKGROUND

1. Field of the Invention

The present invention relates to current sensors, and more particularly, to a current sensor having an improved reset circuit.

2. Description of the Related Art

Figure 1:
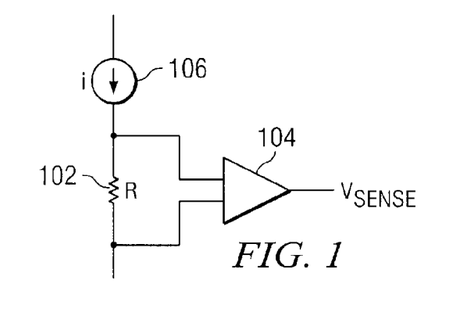
FIG. 1 illustrates a prior art current sensor.

Within various circuit implementations, such as power supplies, there is often a need to detect a current provided at a particular point within a circuit. For example, a detected current may be used as feedback for controlling other parts of a circuit. Various techniques are presently used to sense currents within electronic circuits, but each of these techniques have shortcomings. One approach, illustrated in FIG. 1, utilizes a resistor 102 connected across the inputs of an operational amplifier 104 to provide a voltage $V_{SENSE}$ that may be used to determine a current 106. A low value resistor, in the range of 10 mOhms, may be implemented. However, a drawback of this approach is the high loss provided by the circuit. The high loss may be mitigated by reducing the value of the resistor 102, however, this also reduces the signal $V_{SENSE}$ that may be detected. While this type of circuit may be used to sense current in direct current (DC) applications, the resistor 102 has usually not been capable of being readily integrated.

Figure 2:
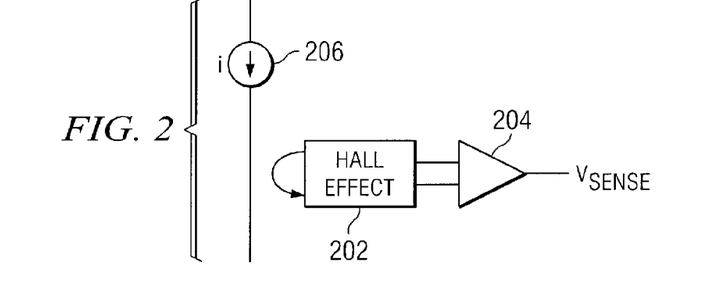
FIG. 2 illustrates a further prior art current sensor.

Referring now to FIG. 2, a further prior art system, utilizing a Hall effect device 202, connected across the inputs of an operational amplifier 204, is illustrated. The Hall effect device 202 generates a voltage across the inputs of the operational amplifier 204, responsive to a current 206, to provide an output signal $V_{SENSE}$. While this approach has a relatively low loss and may be used to detect direct current (DC), the use of the Hall effect device 202 generally provides a circuit having a higher cost. Furthermore, accuracy and noise issues are generally greater in current sensors that implement a Hall device, as the Hall voltage is a relatively small value.

Figure 3:
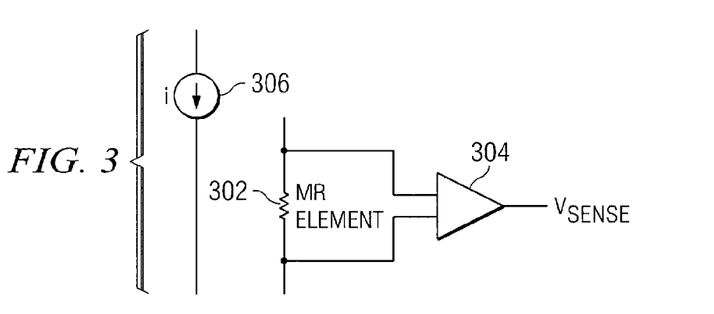
FIG. 3 illustrates yet another prior art current sensor.

With reference to FIG. 3, a current sensor that uses a magneto resistive sensor is illustrated. The magneto resistive sensor consists of a magneto resistive element 302 connected across the inputs of operational amplifier 304 to detect a current 306. The magneto resistive element 302 has the property that the resistance of the element changes with respect to the magnetic field caused by the current 306. This circuit requires the use of special technology which raises the cost of the device. Additionally, accuracy issues arise even though the current may be sensed with very low loss.

Figure 4:
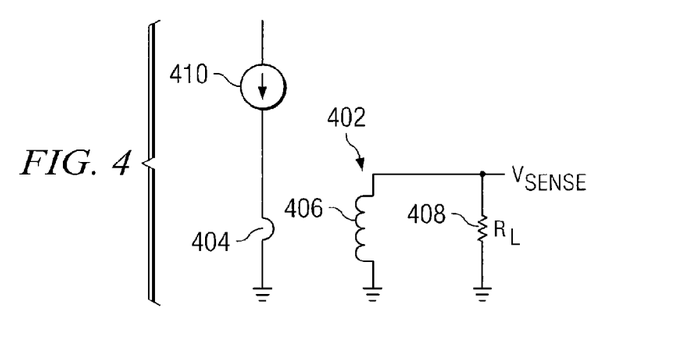
FIG. 4 illustrates a further prior art current sensor.

Referring now to FIG. 4, an alternative prior art technique for detecting current, through the use of a current transformer 402, is illustrated. As is shown, the current transformer 402 has a primary side 404 with a single loop and a secondary side 406 with multiple loops. A load resistance 408 is in parallel with the secondary side 406 of the transformer 402. The current transformer 402 is used to detect a current 410. The transformer 402 creates an output current equal to $I_p/n$, with $I_p$ being the detected current and n being the turns ratio of the transformer 402. In this configuration, the resistance of the secondary side of the transformer is reflected to the primary side with the ratio $1/n^2$. While current transformers work well for detecting currents, they are large and have a medium loss level and only work with alternating current (AC) circuits.

Another method for measuring currents involves the use of a Rogowski coil. Unfortunately, the voltage induced in a Rogowski coil is very small and easily disturbed when a measured current is less than, for example, 100 Amps. However, a Rogowski current transducer has a number of advantages over the current transformer illustrated in FIG. 4. For example, the Rogowski current sensor is linear, has no core saturation effects, has a wide bandwidth and a wide measurement range and is a relatively simple structure. The Rogowski coil comprises a toroidal winding placed around a conductor being measured. The Rogowski coil is effectively a mutual inductor coupled to the inductor being measured, where the output from the winding is an EMF proportional to the rate of change of current. While the above described techniques provide an indication of a sensed current in certain applications, the techniques, as noted above, individually have a number of short comings.

What is needed is a technique for detecting a current, within, for example, a power electronic circuit, that addresses many of the shortcomings of the prior art techniques described above. It would be desirable for a current sensor configured according to the technique to be capable of being reset without adversely effecting a subsequent output signal provided by the current sensor.

SUMMARY

According to one embodiment of the present invention, a current sensor includes an integrator for providing an output signal responsive to a detected current, corresponding to a first current, and a reset circuit. The reset circuit, responsive to a control signal, supplies a reset signal to reset the integrator. The integrator is maintained in a reset state for a length of time that is shorter than an assertion time of the control signal. According to another aspect of the present invention, the current sensor also includes a first inductor for receiving the first current and one or more additional inductors positioned proximate to the first inductor. The one or more additional inductors provide the detected current to the integrator responsive to the first current. In an embodiment, the integrator is reset by causing a capacitor of the integrator to be shorted by, for example, providing a switch across terminals of the capacitor to facilitate shorting the capacitor responsive to the reset signal. According to various aspects of the present invention, the integrator is reset when the first current is substantially zero.

The first inductor may be implemented within a single integrated circuit package. Similarly, one or more additional inductors, the integrator and the reset circuit may be implemented within an integrated circuit die. In at least one embodiment, the reset circuit includes a one-shot circuit and at least one logic gate. In this embodiment, the one-shot circuit includes an input and an output and the at least one logic gate includes a first input, a second input and an output. The input of the one-shot circuit and the first input of the at least one logic gate receive the control signal and the output of the one-shot circuit is coupled to the second input of the at least one logic gate. The output of the at least one logic gate provides the reset signal to the integrator, whose pulse width is less than a pulse width of the asserted control signal. In at least one embodiment, the current sensor includes a switch, e.g., a field-effect transistor (FET) that is used to reset the integrator in response to the reset signal. In an embodiment, the integrator includes an operational amplifier having an inverting input, a non-inverting input and an output and a capacitor having a first terminal and a second terminal. In this embodiment, the inverting input of the operational amplifier is coupled to the one or more additional inductors and the first terminal of the capacitor, and the second terminal of the capacitor is coupled to the output of the operational amplifier, which provides the output signal.

In another embodiment a method is provided for sensing a first current that includes integrating a detected current corresponding to the first current and providing an output indicative thereof from an integrator; and resetting the integrator in response to a control signal supplied to a reset circuit, the integrator being reset for a time period shorter than a pulse width of the control signal. The method may further include periodically resetting the integrator when the detected current is substantially zero. In an embodiment the method includes supplying the control signal to a one shot circuit included in the reset circuit and generating a reset signal to the integrator having a pulse width shorter than the control signal. The method may further include supplying the control signal as an external signal supplied to an integrated circuit incorporating the one shot circuit and the integrator. In an embodiment the method further includes receiving the first current in a first inductor; and providing the detected current responsive to the first current using one or more additional inductors coupled to the integrator and positioned proximate the first inductor.

BRIEF DESCRIPTION OF THE DRAWINGS

The present invention may be better understood, and its numerous objects, features, and advantages made apparent to those skilled in the art by referencing the accompanying drawings.

DESCRIPTION OF THE PREFERRED EMBODIMENT(S)

Figure 5A:
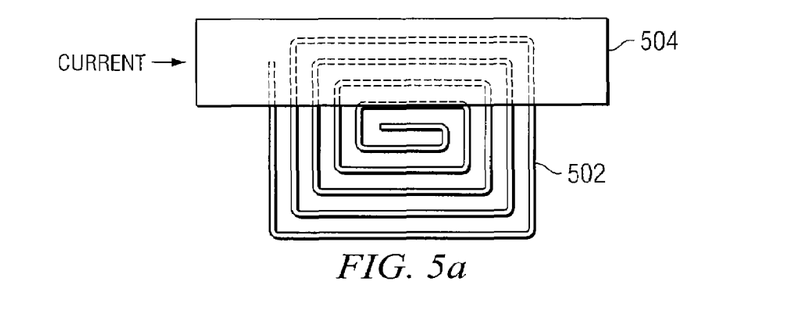
FIG. 5a illustrates a coil in close proximity with a large current carrying wire, according to an embodiment of the present invention.

Referring now to the drawings, and more particularly to FIG. 5a, there is illustrated a coil 502 in close proximity with a large current carrying wire (or conductor) 504 such that the coil 502 and current carrying wire 504 act as coupled inductors. The coupled inductors, along with on-chip electronics, which will be discussed herein below, allow for the creation of the $V_{SENSE}$ signal which is proportional to an input current $i_p$ in a manner that has very low loss, is very small and is a low cost implementation. This generally provides a better solution than the implementations described with respect to FIGS. 1-4. The current provided through the current carrying wire 504 may be up to, for example, 10A. The coil 502 is placed near the current carrying wire 504 in order to create inductive coupling between the wire 504 and coil 502. As shown, the wire 504 only overlaps only one side of the coil 502 such that the windings are all going the same way and the magnetic flux adds together. This causes an induced current in the other side of the coil 502 that is not overlapped by the wire 504.

Figure 5B:
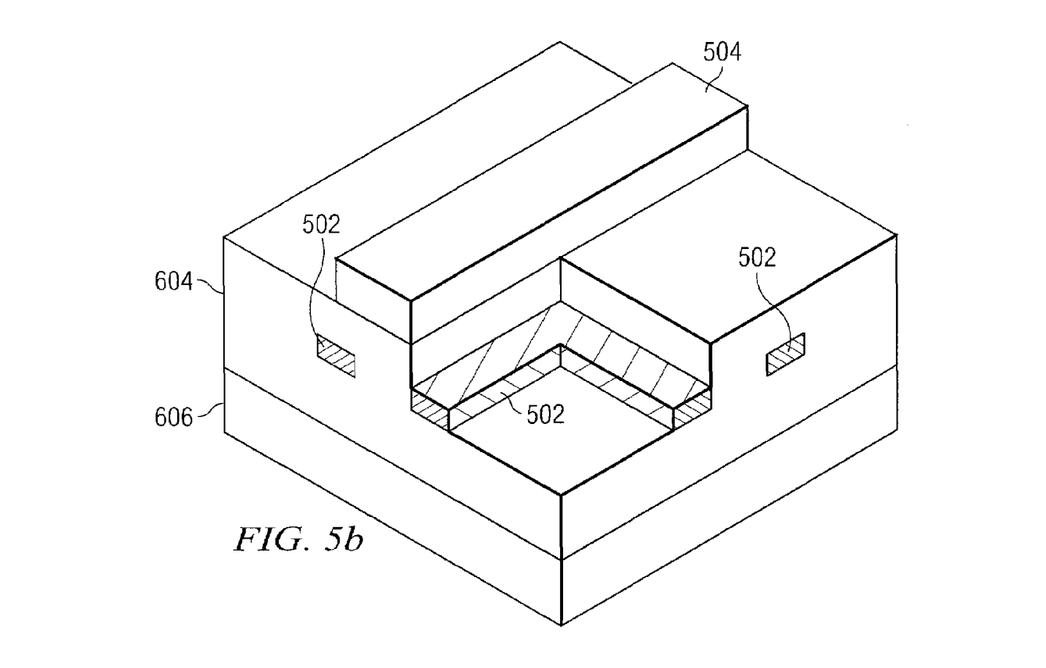
FIG. 5b illustrates a perspective cut away view of an integrated circuit, including a coupled coil and wire.

Referring now to FIG. 5b, there is illustrated a perspective cut away view of the coil 502 and wire 504 illustrated in FIG. 5a. In this configuration one of the coupled inductors is placed within a silicon dioxide layer 604 on top of a die 606 of an integrated circuit chip. The coil 502 consists of metal runs in, for example, an M5 layer located within the silicon dioxide layer 604. The wire 504 would rest on the silicon dioxide layer 604 in close enough proximity to the coil 502, such that current passing through the wire 504 would induce another current within the portion of the coil 502 over which the wire 504 was not located.

Figure 6:
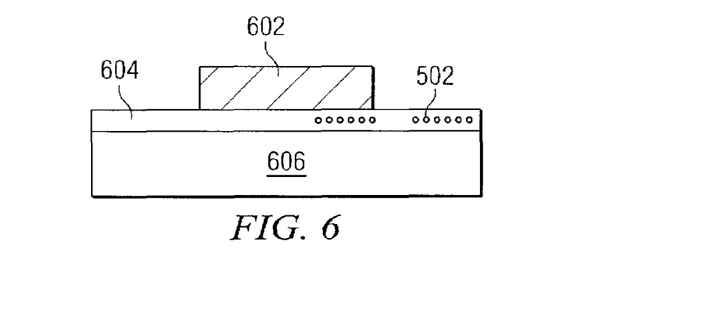
FIG. 6 is a cross-sectional view of a first embodiment of an integrated current sensor package.

There are multiple ways for implementing the coupled inductor configuration within a chip package. The first of these comprises an on-chip solution with bumping copper, as illustrated in FIG. 6. Flip chip bump houses can deposit a copper wire 602 on top of a silicon dioxide layer 604 of a die 606. The copper wire 602 may comprise, for example, 15 μm of copper. As is illustrated, the coil 502 is embedded within the silicon dioxide layer 604.

Figure 7:
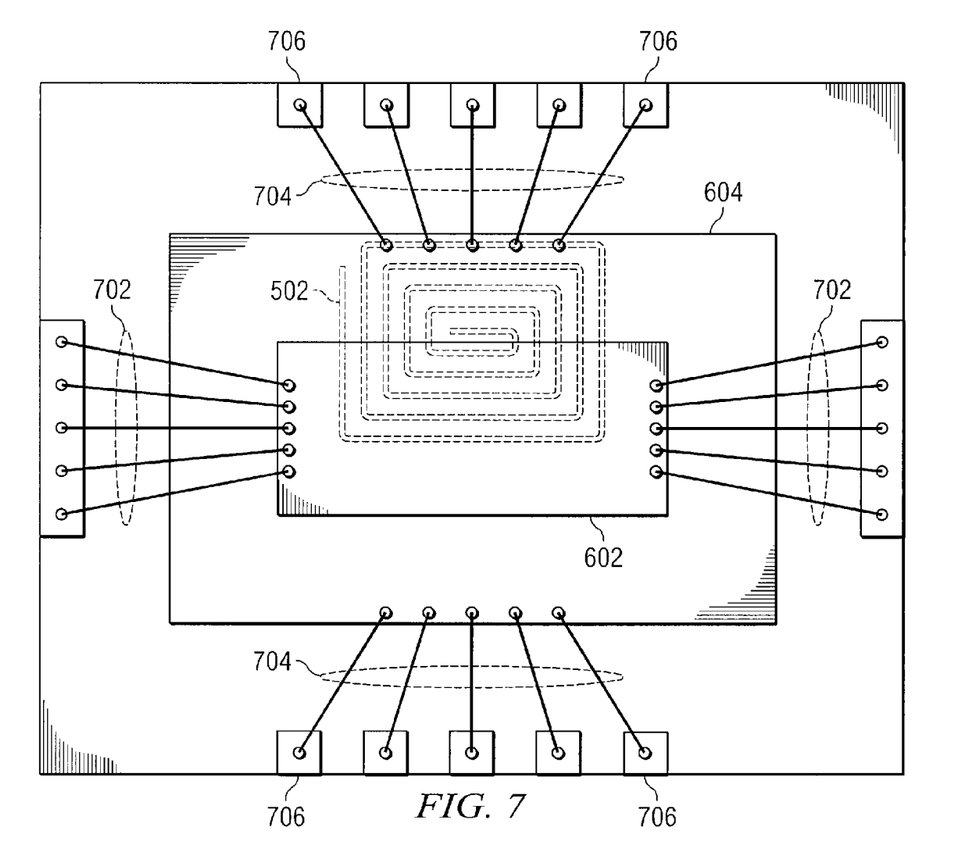
FIG. 7 is a top view of the first embodiment of the integrated current sensor package.

Referring now to FIG. 7, there is illustrated a top view of the package configuration. The copper wire 602 is placed upon the silicon dioxide layer 604 of the die 606 (not shown in FIG. 7). The coil 502 is located within the silicon dioxide layer 604 parallel to the wire 602. Bond wires 702 connect the copper wire 602 on the die 606 with external outputs. The bond wires 702 typically support a maximum current of 1-2 amps, thus many bond wires are required to be connected to the copper wire 602 for higher currents. Additional bond wires 704 connect portions of the die 606 to external pins 706 of the chip. Using the above-described package configuration, a 10A sensor may be readily constructed.

Figure 8:
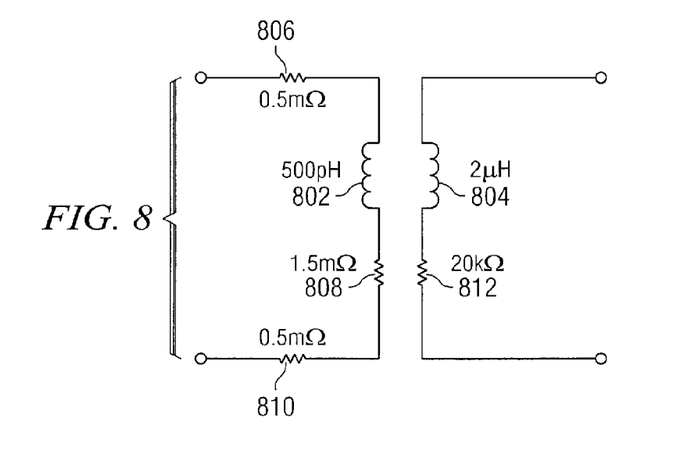
FIG. 8 is a model (equivalent circuit) of the integrated current sensor illustrated in FIGS. 6 and 7.

Referring now to FIG. 8, there is provided a model (equivalent circuit) of the inductive coil package illustrated in FIGS. 6 and 7. The coil 802 on the primary side comprises a 500 pH coil. The coil 804 on the secondary side comprises a 2 µH coil. Connected to a first side of the 500 pH coil 802 is a 1.5 mOhm resistor 808 in series with a 0.5 mOhm resistor 810. Connected to one output side of the 2 µH coil 804 is a 20 kOhm resistor 812. The 0.5 mOhm resistor 810 comprises the resistance provided by the coil 802. Since the copper wire 602 is not too thick and lies very close to the coil 502 of the chip, coupling coefficients between the copper wire 602 and the coil 502 are very good, assuming there is a distance of approximately two microns from the coil 502 (e.g., formed in an M5 layer) to the copper wire 602.

Figure 9:
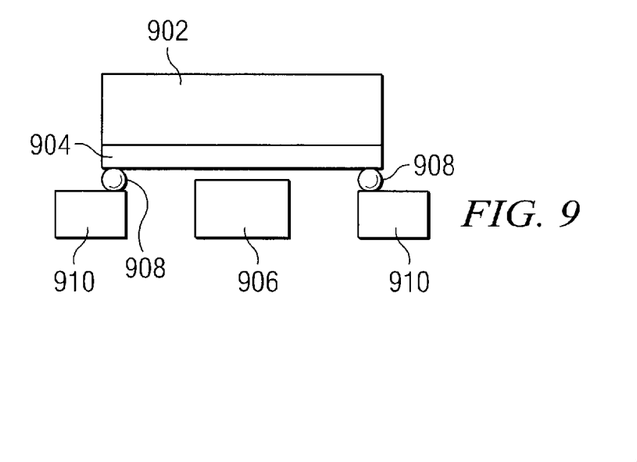
FIG. 9 is a cross-sectional view of an alternative embodiment of the integrated current sensor package.

Referring now to FIG. 9, there is illustrated an alternative configuration wherein a package lead frame and flip chip configuration are used. A custom package lead frame may be designed as follows. The die 902 is placed upside down with the silicon dioxide layer 904 suspended a short distance above a large copper slug 906. The copper slug 906 may have a large cross-sectional area for low loss. In this embodiment the slug 906 has a 200×200 µm cross-section. The die 902 is suspended above the copper slug 906 on solder balls 908, which rest on top of a lead frame 910. When heat is applied to the circuit, the solder bumps 908 reflow causing the silicon dioxide layer 904 to rest directly upon the copper slug 906. In this design, the die chip 902 would be bumped and then flipped.

Figure 10:
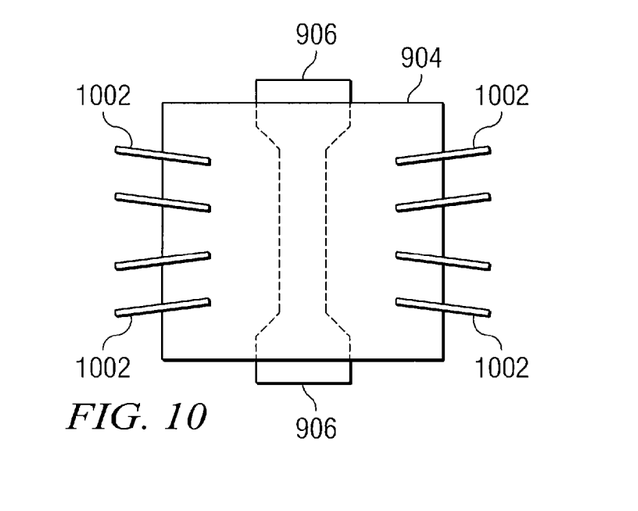
FIG. 10 is a top view of the alternative embodiment of the integrated current sensor package of FIG. 9.

Referring now to FIG. 10, there is illustrated a top view of the embodiment of FIG. 9 with the silicon dioxide layer 904 resting on top of the copper slug 906. Bond wires 1002 may then be connected to appropriate portions of the M5 (or other metal layers) formed within the silicon dioxide layer 904. This design has a very low resistance.

Figure 11:
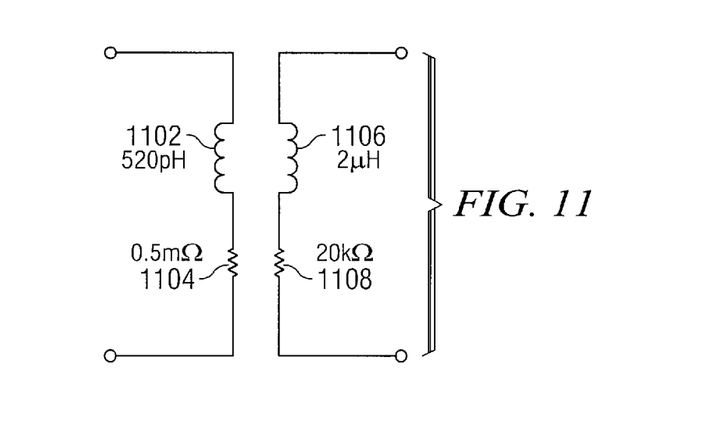
FIG. 11 is a model (equivalent circuit) of the alternative embodiment of the integrated current sensor package illustrated in FIGS. 9 and 10.

Referring now to FIG. 11, there is illustrated a circuit representation of the embodiment illustrated in FIGS. 9 and 10. In this representation, a 200×200 µm copper slug 906 is utilized that is 3 µm away from the coil 502, and the primary side includes a 520 pH coil 1102 in series with a 0.5 mOhm resistor 1104. The secondary side consists of 2 µH coil 1106 in series with a 20 kOhm resistor 1108. The coupling coefficient is reduced due to the lower current density in the slug.

Figure 16:
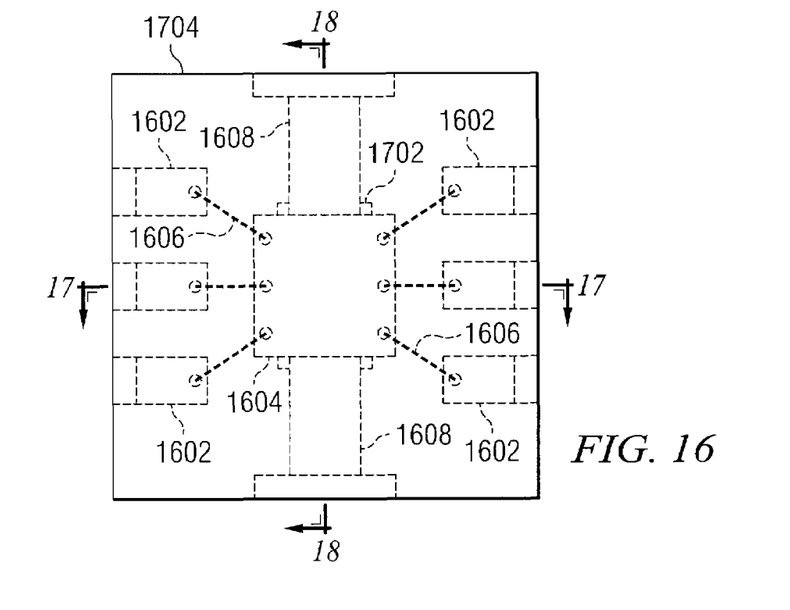
FIG. 16 is a top view of a further embodiment of the integrated current sensor package.

With reference to FIG. 16 there is illustrated a bottom view of a further configuration wherein a lead on chip configuration is used. The lead frame 1602 is connected to die 1604, by bond wires 1606. The wire 1608 is connected to the die 1604 by, for example, tape 1702. The wire 1608, a current carrying conductor, is inductively coupled to a coil in the die 1604.

Figure 17:
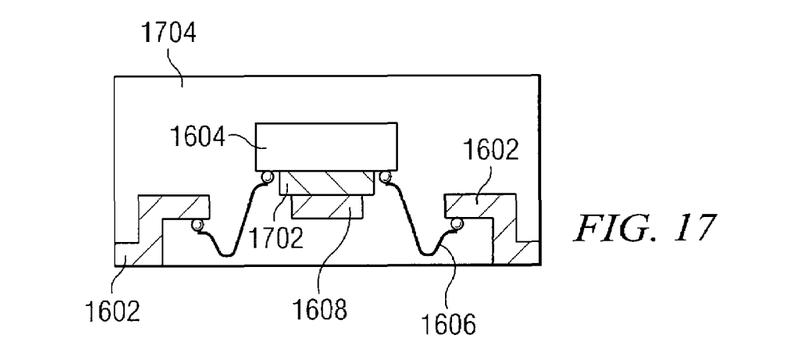
FIG. 17 is a cross-sectional view of the embodiment of the integrated current sensor package in FIG. 16, along the line 17-17.
Figure 18:
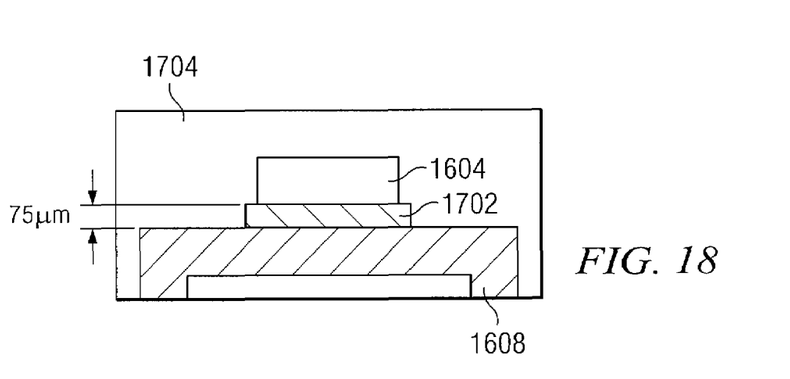
FIG. 18 is a further cross-sectional view of the embodiment of the integrated current sensor package in FIG. 16, along the line 18-18.

Referring now to FIG. 17, there is illustrated a cross-sectional view of FIG. 16, along line 17-17. The die 1604 is connected to the wire 1608, via the tape 1702, as described previously. The lead frame 1602 connects to the die 1604, via bond wires 1606. The tape 1702 may be, for example, approximately 75 µm thick. As is shown, the structure is contained within a mold compound 1704. Referring now to FIG. 18, there is illustrated a cross sectional view of FIG. 16, along line 18-18.

Figure 12:
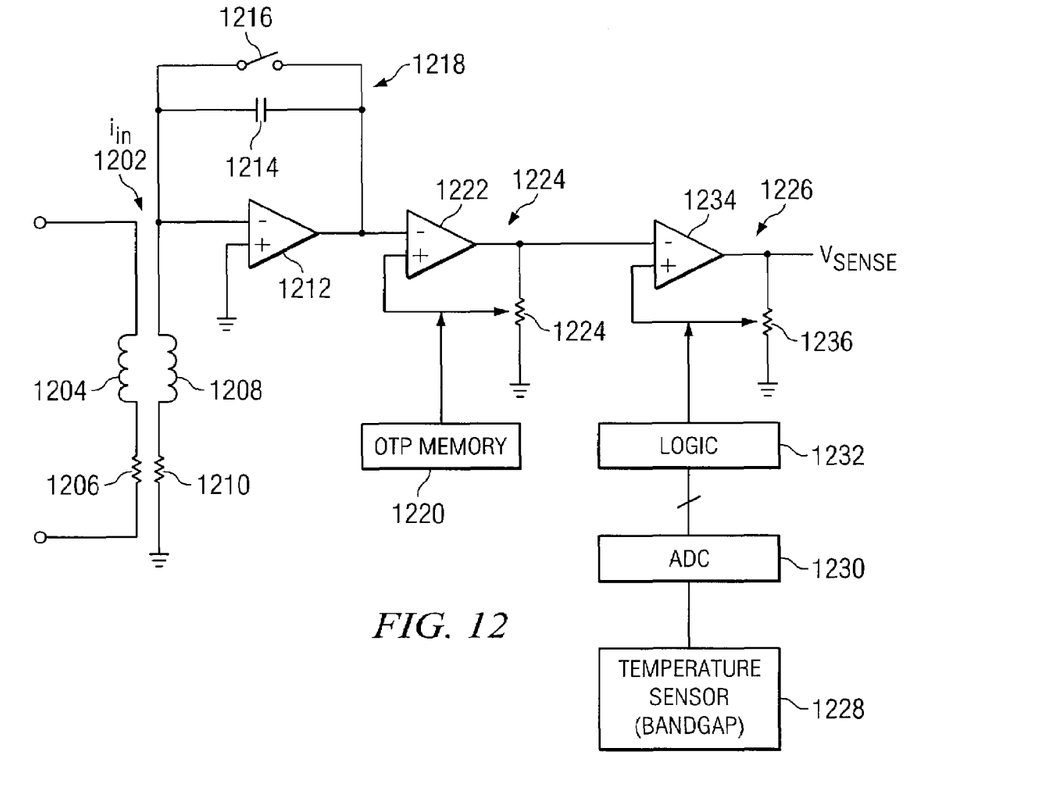
FIG. 12 is a schematic diagram of an integrated current sensor.

Turning to FIG. 12, there is illustrated a schematic diagram of the electronic circuit necessary for recreating the $V_{SENSE}$ signal when detecting the current $i_p$ using the coupled inductors as illustrated in FIGS. 5A and 5B. The coupled inductor 1202 comprises either of the configuration packages described hereinabove or, alternatively, may comprise a different undescribed configuration package that places the coil in close proximity with the wire to inductively couple them together. The primary side is modeled by inductor 1204 in series with resistor 1206. The secondary side is modeled by inductor 1208 which is connected to a resistor 1210. The resistor 1210 is then connected to ground. The other side of inductor 1208, which is connected to the negative (inverting) input of an operational amplifier 1212, outputs the induced current $I_n$. The positive (non-inverting) input of operational amplifier 1212 is connected to ground.

The current through the secondary is dominated by the resistive loss of resistor 1210 and is the derivative of the primary current. An integrator circuit 1218 is used to integrate the induced current $I_n$. The integrator circuit 1218 includes the operational amplifier 1212, a capacitor 1214 (connected between the output of operational amplifier 1212 and the negative input of operational amplifier 1212) and a reset switch 1216 (connected between the output of operational amplifier 1212 and the negative input of operational amplifier 1212) in parallel with the capacitor 1214. Thus, the current $I_n$ may be determined according to the equation:

$$I_n = (L_m/R_1)(di_p/dt)$$

By integrating on the capacitor 1214 an output voltage $V_{SENSE}$ is attained according to the following equation:

$$V_{SENSE} = 1/C \int I_n dt = (L_m/R_1 C) i_p$$

In this case, $L_m$, the mutual inductance, is well controlled, but can vary from part to part due to assembly variations. The capacitance C will vary from part to part and probably can be controlled to ±/−5% accuracy. The capacitor 1214 will generally not have any appreciable temperature coefficient. $R_1$ is dominated by the metal resistance of the coil and will vary from part to part and is equal to the value of the resistor 1210 and also has a large temperature coefficient.

In order to obtain overall accuracy for the capacitance C which varies from part to part, factory calibration using a one time programmable (OTP) memory 1220 can be used. In a preferred embodiment, a low cost 32-bit OTP memory may be utilized. The OTP memory 1220 provides a control variable to a programmable gain amplifier 1222. The first gain stage 1223, consisting of programmable amplifier 1222, programmable resistance 1224 and the OTP memory 1220, compensates for part to part variations of the circuit. The OTP memory 1220 is programmed at the factory based upon measurements made there. The programmable gain amplifier 1222 has its negative input connected to the output of the operational amplifier 1212. A programmable resistance 1224 is connected between the output of the programmable amplifier 1222 and ground. The positive input of programmable amplifier 1222 is connected to the programmable resistance 1224. The value of the programmable resistance 1224, and thus the gain of the first gain stage 1223, is controlled by the values provided from the OTP memory 1220.

A second gain stage 1226 compensates for differences in the resistance caused by temperature variations in the device. A temperature sensor 1228 and an analog-to-digital converter (ADC) 1230 are used to generate a digital temperature value to compensate for the coil resistance temperature coefficient. The temperature sensor 1228 detects the temperature and generates an analog representation of the temperature. The ADC 1230 converts the analog signal into a digital signal. The digital temperature value is provided, via a control bus 1231, to control logic 1232. In one embodiment the control logic 1232 may consist of a look-up table. The look-up table would include various control values associated with particular temperature values. Alternative embodiments may include a microprocessor programmed to control the output according to various temperature levels or other types of digital logic. The control logic 1232 provides a control value to the programmable gain amplifier 1234 and programmable resistance 1236. The negative input of the amplifier 1234 is connected to the output of programmable amplifier 1222. The programmable resistor 1236 is connected between the output of programmable amplifier 1234 and ground. The positive input of the amplifier 1234 is connected to the programmable resistance 1236. The particular value of the programmable resistance 1236, and thus the gain of the second gain stage 1226, is controlled via the output from the control logic 1232. The output of the amplifier 1234 provides the compensated $V_{SENSE}$ signal. The code provided by the control logic 1232 is updated during the phase in which the operational amplifier 1212 is reset responsive to a reset signal applied to switch 1216. The reset signal is applied while the sensed current $i_p$ is zero.

Figure 13:
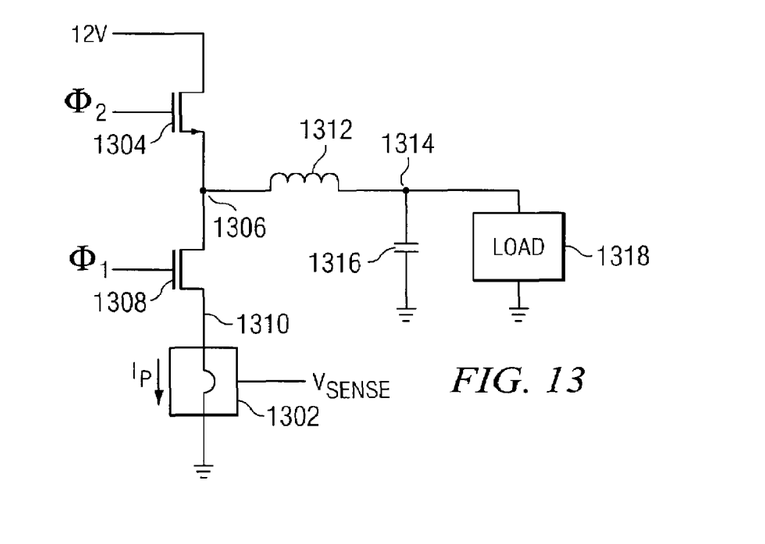
FIG. 13 is a schematic diagram illustrating an integrated current sensor within a switched power supply circuit.

The current sensor is designed to be used in, for example, a switched power supply. When the current $i_p$ is equal to zero, a reset signal may be applied to switch 1216 to reset the capacitor 1214, and the logic value applied to amplifier 1234, via control logic 1232, is updated responsive to the presently sensed temperature from temperature sensor 1228. Referring now to FIG. 13, there is provided one example of how to apply the reset signal to a current sensor 1302 within a buck converter circuit. In this case, the buck converter circuit control signal $\phi_2$ is applied to a transistor 1304 having its drain/source path connected between 12 volts and node 1306. A second transistor 1308 has its drain/source path connected between node 1306 and node 1310. The transistor 1308 is controlled by a second control signal $\phi_1$. The current sensor 1302 is connected between node 1310 and ground to detect current $i_p$ and provide a control signal $V_{SENSE}$. An inductor 1312 is connected between node 1306 and node 1314. A capacitor 1316 is connected between node 1314 and ground. A load 1318 is also connected between node 1314 and ground. In one embodiment, the reset signal to switch 1216 of the current sensor 1302 may be configured to be the control signal $\phi_2$.

Figure 14:
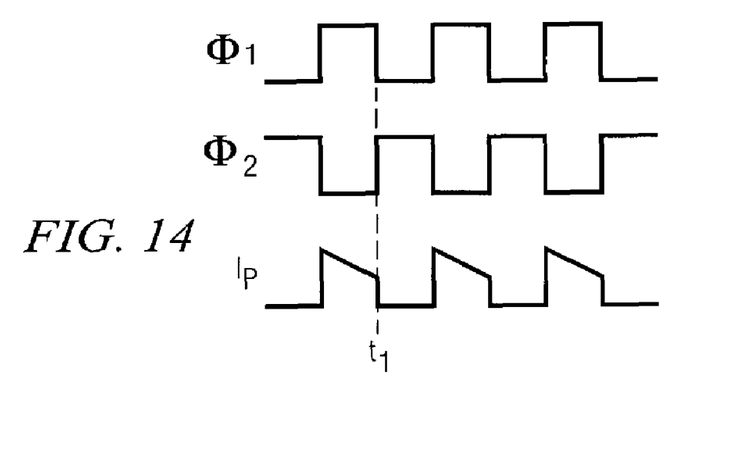
FIG. 14 is a timing diagram illustrating operation of the switched power supply circuit of FIG. 13.

As illustrated in FIG. 14, the current $i_p$ is zero when signal $\phi_1$ goes low and when signal $\phi_2$ goes high at, for example, time $t_1$. Integrator 1218 is reset during phase two when signal $\phi_2$ goes high and the current sensor would accept signal $\phi_2$ as an input to drive the reset signal to switch 1216, since the current $i_p$ is zero during this time. As can be seen each time the signal $\phi_2$ goes high, the current $i_p$ is zero enabling the reset signal to be applied to the integrator circuit 1218.

Figure 15:
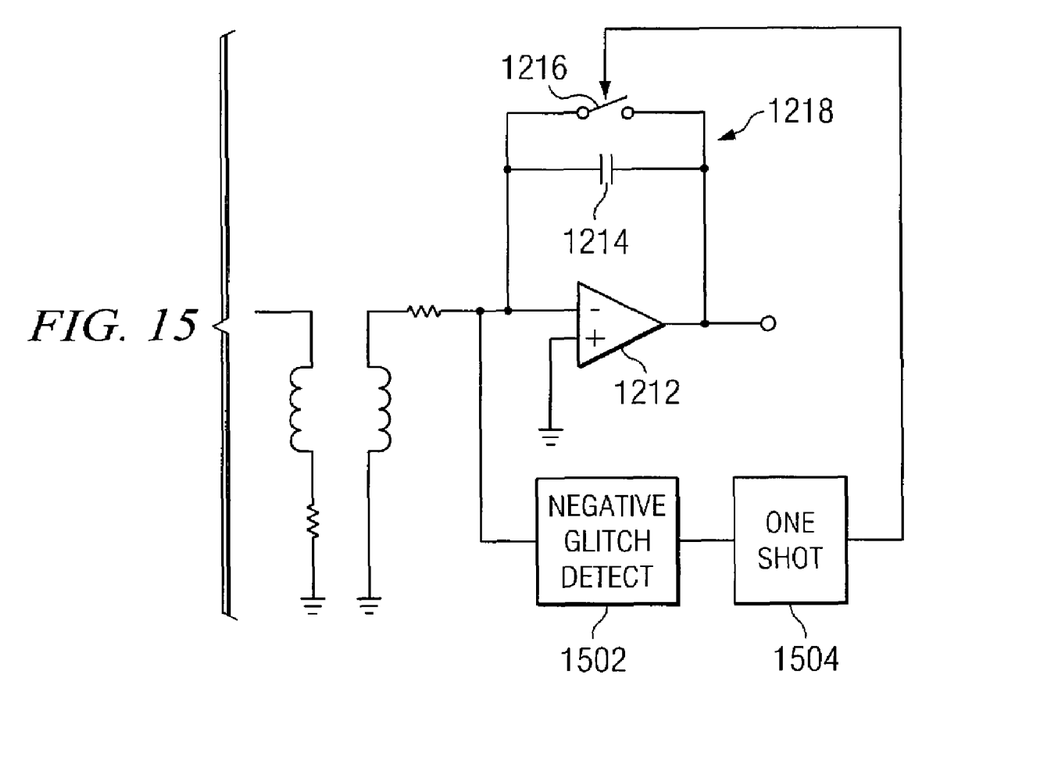
FIG. 15 illustrates a further circuit for controlling a reset switch of an integrated current sensor.

Referring now to FIG. 15, there is illustrated an alternative embodiment wherein the reset signal to the reset switch 1216 is generated responsive to a one-shot circuit consisting of negative glitch detect circuit 1502 and one-shot circuit 1504. When the current $i_p$ goes low as illustrated, for example, at $t_1$ in FIG. 14, the negative glitch detect circuit 1502 will detect the negative edge of current $i_p$. In response to this detection, the negative glitch detect circuit 1502 generates a pulse to the one-shot circuit 1504. The one-shot circuit 1504 then generates the reset signal to the reset switch 1216 responsive to the pulse from the negative glitch detect circuit 1502. Other methods for detecting when the sensed current $i_p$ goes to zero may also be utilized for generating the reset signal to reset switch 1216. The examples illustrated in FIGS. 13-15 are merely provided as examples of some embodiments thereof.

Figure 19:
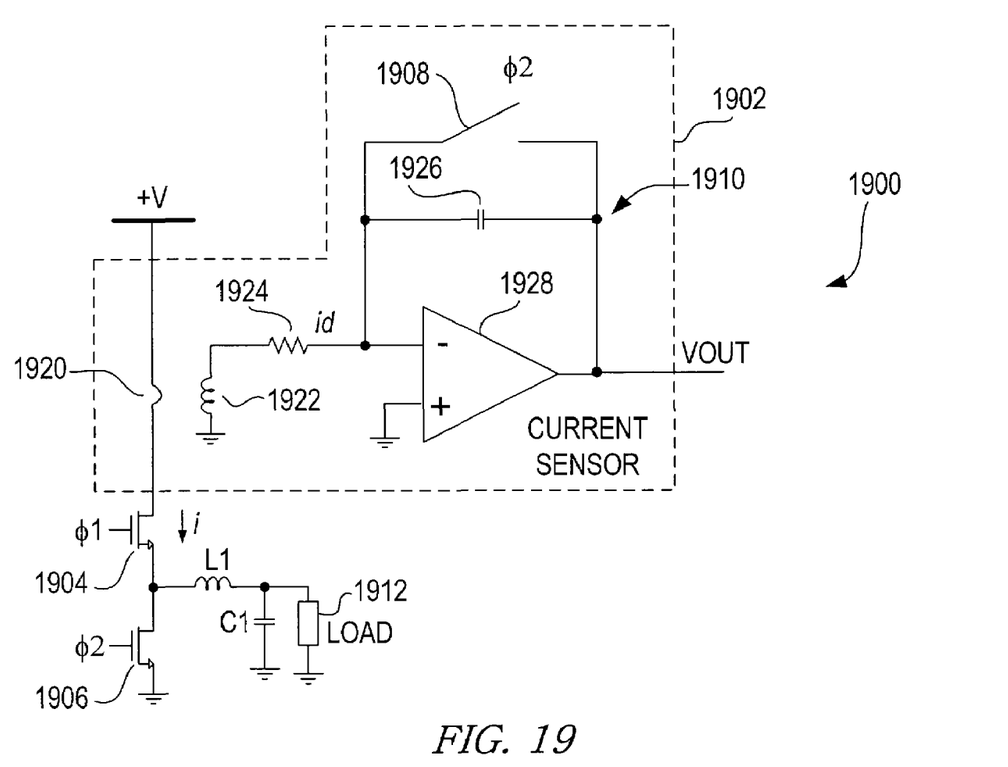
FIG. 19 is an electrical schematic of a circuit that includes a current sensor implemented in a buck converter application.
Figure 19A:
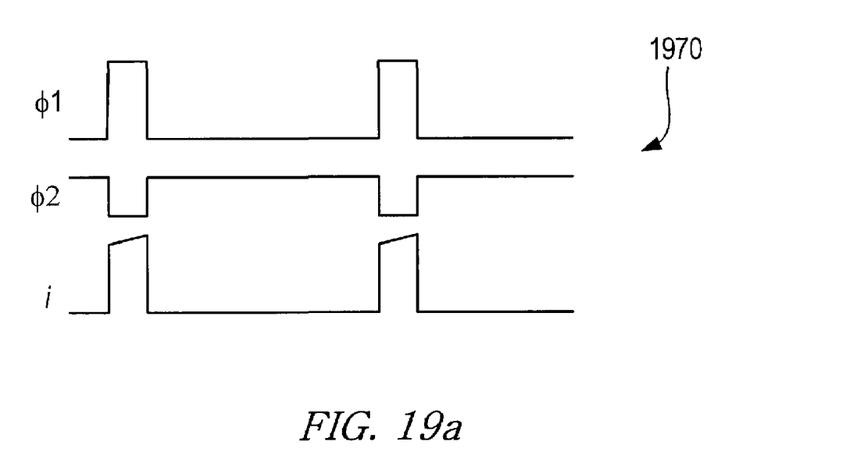
FIG. 19a is a timing diagram illustrating operation of the circuit of FIG. 19.

With reference to FIG. 19, a relevant portion of a buck power converter 1900 is depicted that includes a current sensor 1902 that senses a current provided by a power source +V. Referring to FIG. 19a, a timing diagram 1970 depicts various waveforms used in conjunction with the converter 1900. In this application, a signal $\phi_1$ drives switch 1904 to cause a current 'i' to flow (from the power source +V through an inductor 1920) and power to be provided to a load 1912, through an inductor L1 and a capacitor C1. The current 'i' that flows through the inductor 1920 induces a current that flows through the inductor 1922 and resistor 1924, charging capacitor 1926. When the switch 1904 is conducting, switch 1906 is in a non-conducting state. Similarly, when the switch 1904 is in a non-conducting state, a signal $\phi_2$ drives switch 1906 into a conducting state. The switches 1904 and 1906 may be, for example, implemented as enhancement-mode field-effect transistors (FETs).

As is also shown, the signal $\phi_2$ may also function as a reset signal to drive a switch 1908 which, when conducting, shorts the capacitor 1926 of integrator 1910 and resets the integrator 1910 of the current sensor 1902. It should be appreciated that it is desirable for the reset signal to be turned off prior to a time when the current 'i' again flows through inductor 1920 in order to not adversely affect an output signal VOUT provided by the integrator 1910. In modern power converters this requirement can be difficult to meet as the falling edge of the signal $\phi_2$ and the rising edge of the signal $\phi_1$ may slightly overlap. In this event, the integrator 1910 may still be in a reset state when the current 'i' again begins flowing through the inductor 1920. As a result, the output signal VOUT (provided by the integrator 1910) will not provide an accurate indication of the current 'i' that flows through the inductor 1920. This is particularly true for a current, such as the current 'i' shown in FIG. 19a, where the induced current is proportional to di/dt and the change in 'i' is most pronounced at the start of $\phi_1$.

Figure 20:
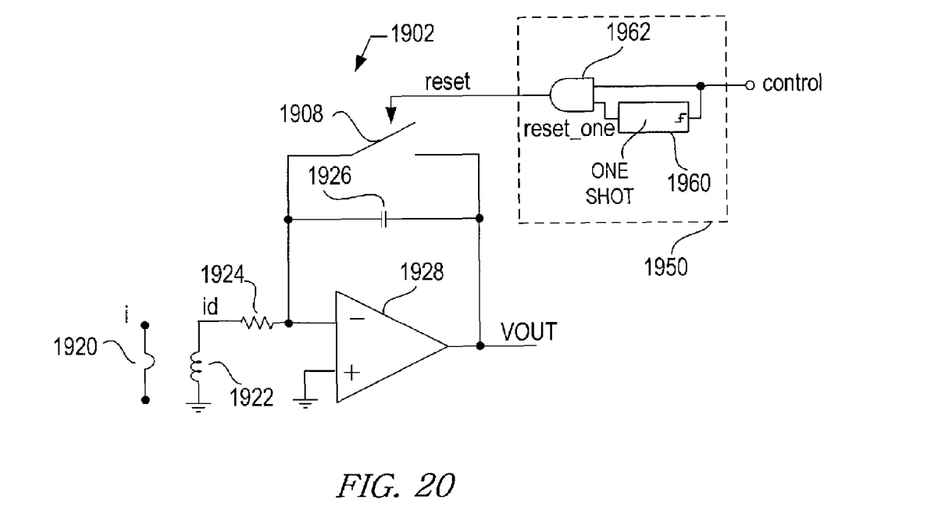
FIG. 20 is an electrical schematic of a circuit that includes a current sensor with a reset circuit, configured according to one aspect of the present invention.
Figure 20A:
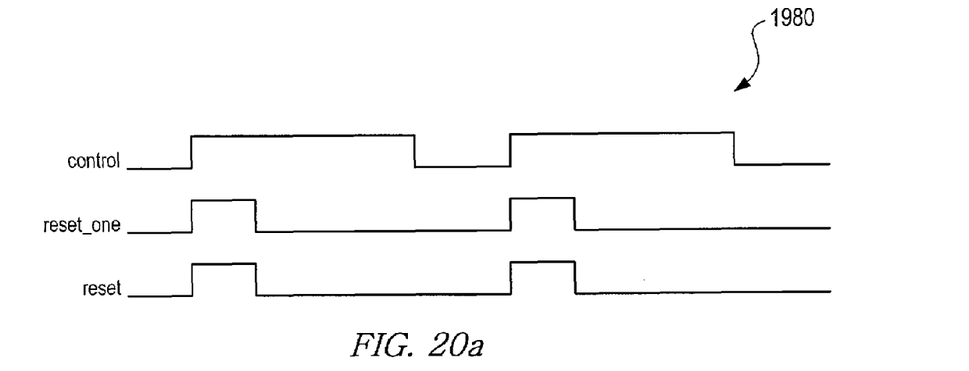
FIGS. 20a and 20b are timing diagrams that illustrate operation of the reset circuit of FIG. 20.
Figure 20B:
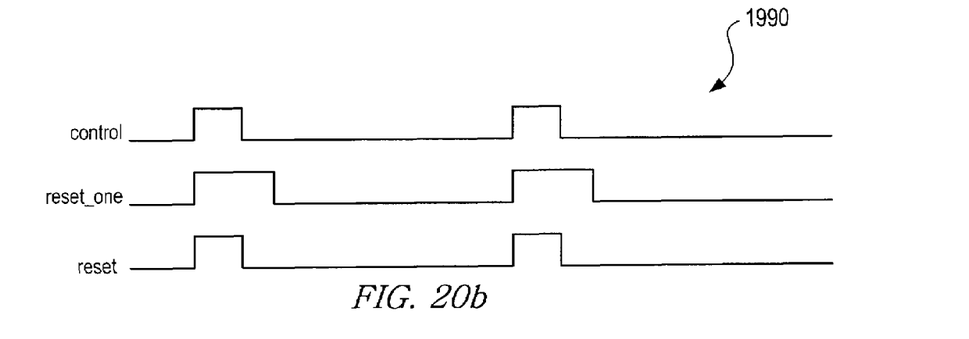

Turning to FIG. 20, a reset circuit 1950, configured according to one aspect of the present invention, is shown implemented in conjunction with the current sensor 1902 of FIG. 19. A control signal, as is shown in timing diagrams 1980 and 1990 of FIGS. 20a and 20b, respectively, corresponds to the signal $\phi_2$ of FIG. 19a. It should, however, be appreciated that the control signal may be a different signal having, for example, a different polarity. The reset circuit 1950 includes a one-shot multivibrator 1960 and an AND gate (or one or more logic gates) 1962. As is used herein, the term "one-shot circuit" or "one-shot multivibrator" is a device with one stable state that, responsive to an input signal, provides an output signal for a period of time before returning to the stable state. A reset signal is provided by the AND gate 1962, responsive to the control signal and a reset_one signal provided at the output of the multivibrator 1960. A pulse width of the reset signal corresponds to a pulse width of the shortest one of the reset and reset_one signals. As such, except for the case of extremely short pulse widths of control signals $\phi_1$ and $\phi_2$, depending upon the implementation, the reset circuit 1950 ensures that the reset of the integrator shorter than the control signals and thus the integrator reset is released before the current rises substantially above zero, thus allowing accurate sensing the current. It should be appreciated that the above-described reset circuit can be readily incorporated within the same integrated circuit that includes the current sensor and the use of $\phi_2$ (or other signal) readily allows for external timing control. Thus, one of the external pins 706 (FIG. 7) can be supplied with an appropriate $\phi_1$ or $\phi_2$ control signal for use to generate the reset signal, depending upon the location of the current sensor. Exemplary placements of the current sensor for a buck converter are illustrated in FIGS. 13 and 19.

Figure 21A:
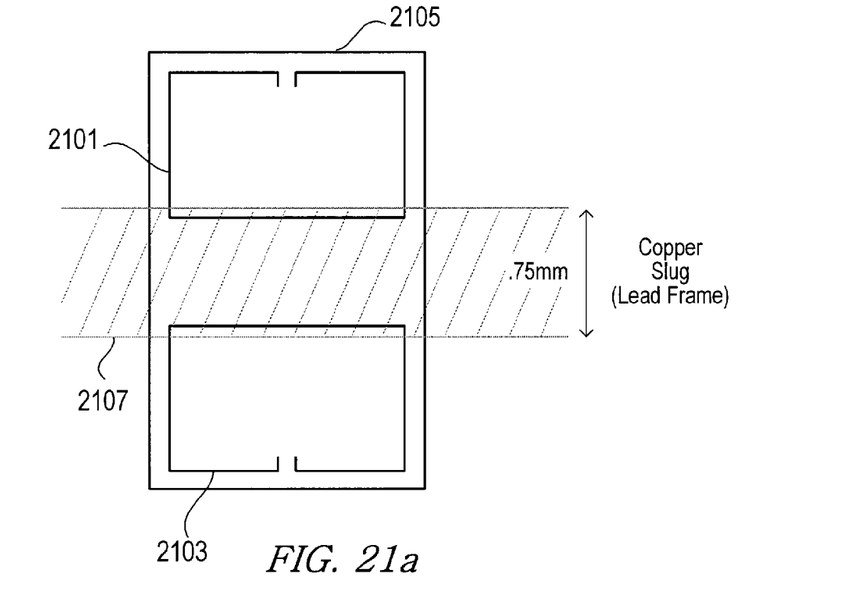
FIGS. 21a illustrates an embodiment in which two coils are used to sense the current instead of one.
Figure 21B:
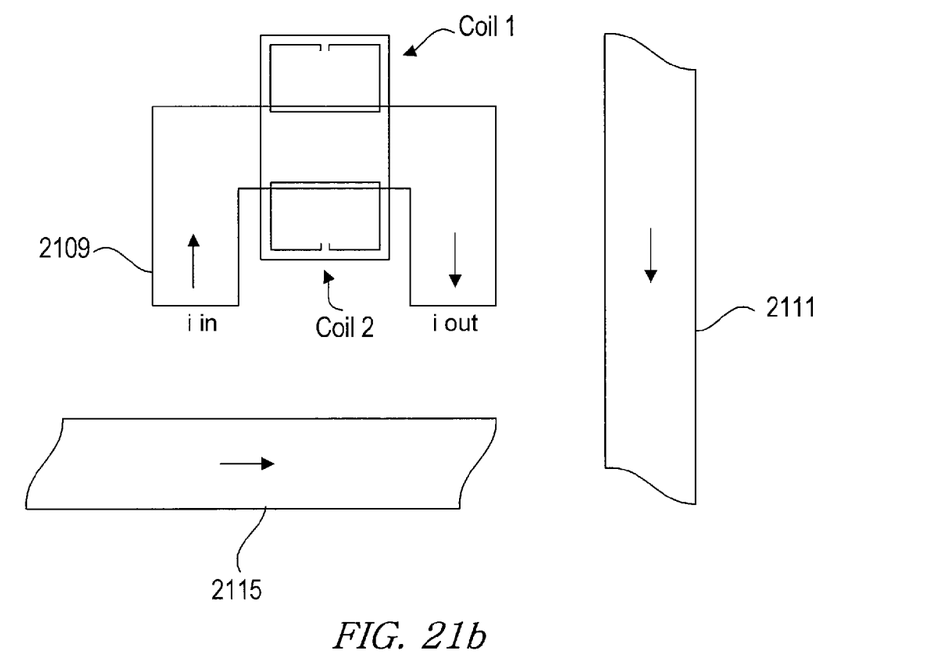
FIG. 21b illustrates another two coil embodiment in which the current carrying wire implemented on the current sensor package is "U" shaped.
Figure 22:
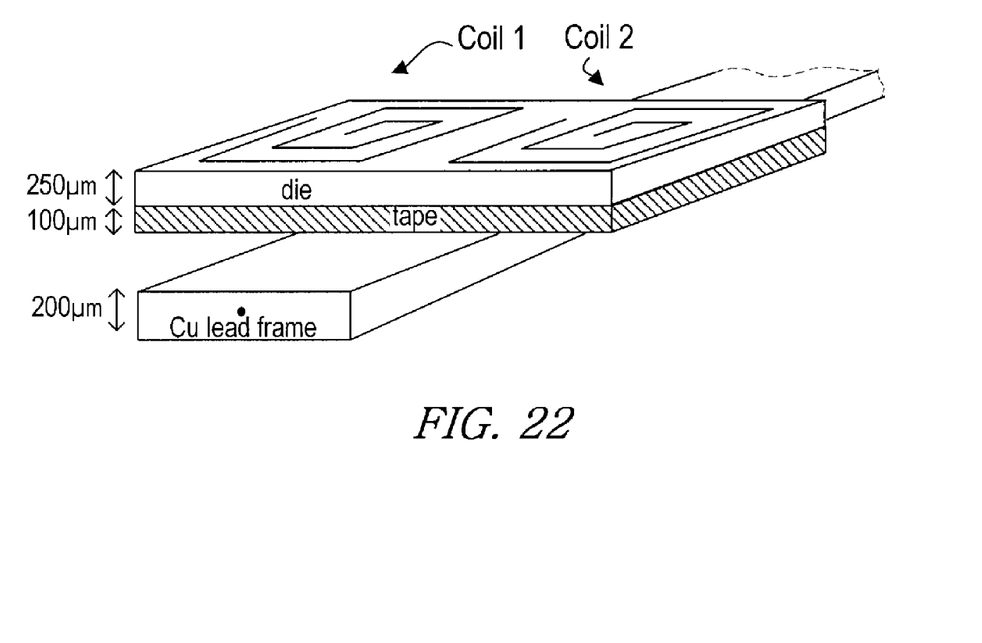
FIG. 22 illustrates another view of an embodiment of a dual coil current sensor.

In another embodiment, two coils are used instead of one to sense the current. Referring to FIG. 21*a* a top view of two coils 2101 and 2103 are seen in die 2105 vertically displaced from the current carrying wire 2107. The coils 2101 and 2103, shown as single turns for ease of illustration, may be multiple turn coils. In an exemplary embodiment the width of the current carrying wire is 0.75 mm. The use of two coils allows significant cancellation of stray fields from external sources, and thus more accurate current sensing in certain environments. In another embodiment illustrated in FIG. 21*b*, the current carrying wire 2109 has a different configuration and is shaped as a "U". Potential interferers, wires 2111 and 2115, are also illustrated. In both embodiments, the current carrying wires 2107 and 2109 may be copper and formed as part of the lead frame package housing the die with the dual coils. FIG. 22 illustrates another view of an embodiment of a dual coil current sensor implementation.

Figure 23:
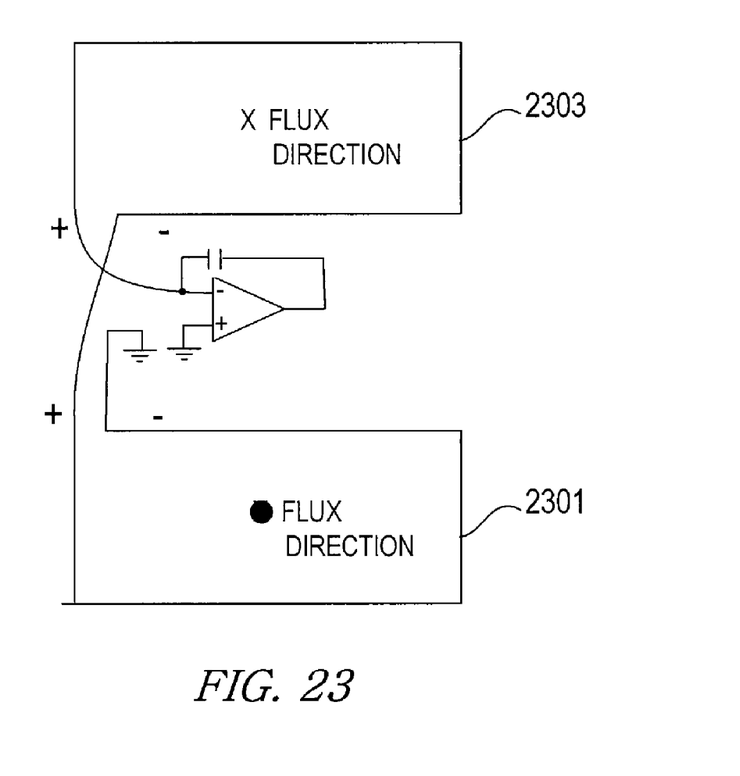
FIG. 23 illustrates of how the dual coils are coupled to the integrator in an exemplary embodiment.

FIG. 23 illustrates an exemplary embodiment of how the dual coils are coupled to the integrator. For ease of illustration, the reset circuit and the calibration and temperature compensation circuits are omitted from the figure. As shown in FIG. 23, the direction of current in coil 2301 and 2303 causes the flux direction in the two coils to be in the opposite direction (one into the page and one out of the page), thus resulting in a substantial improvement in cancellation of interference over a single coil embodiment in certain applications. Note also that in FIG. 23 single turn coils are illustrated. In other embodiments the coils may be implemented with the appropriate number of turns to adequately provide the current sensing capability.

Accordingly, a reset circuit for an integrator has been described herein that ensures that a reset input of an integrator is released before a sensed current rises to a value that would adversely affect an output signal provided by the integrator in response to the sensed current.

Although various embodiments have been described in detail, it should be understood that various changes, substitutions and alterations can be made therein without departing from the scope of the invention as defined by the appended claims.

What is claimed is:

1. A current sensor for sensing a first current, comprising:
   an integrator for providing an output signal responsive to an induced current corresponding to the first current; and
   a reset circuit coupled to receive a control signal and to supply a reset signal to reset the integrator in response to the control signal, the reset signal, when asserted, coupled to cause the integrator to be in a reset state for a time period shorter than an assertion time of the control signal; and
   wherein the reset circuit includes a one-shot circuit and one or more logic gates and wherein the one-shot circuit includes an input and an output and the one or more logic gates includes a first input, a second input and an output, and wherein the input of the one-shot circuit and the first input of the one or more logic gates receive the control signal and the output of the one-shot circuit is coupled to the second input of the one or more logic gates, where the output of the one or more logic gates provides the reset signal whose pulse width is less than a pulse width of the control signal.

2. The current sensor of claim 1, further comprising:
   a first inductor for receiving the first current; and
   one or more additional inductors positioned proximate to the first inductor, the one or more additional inductors providing the induced current responsive to the first current.

3. The current sensor of claim 2, wherein the first inductor is implemented within an integrated circuit package.

4. The current sensor of claim 2, wherein the one or more additional inductors, the integrator and the reset circuit are implemented within an integrated circuit die.

5. The current sensor of claim 2, wherein the integrator is reset when the induced current is substantially zero.

6. The current sensor of claim 2, wherein the integrator includes an operational amplifier having an inverting input, a non-inverting input and an output and a capacitor having a first terminal and a second terminal, and wherein the inverting input of the operational amplifier is coupled to the one or more additional inductors and the first terminal of the capacitor, and the second terminal of the capacitor is coupled to the output of the operational amplifier, which provides the output signal.

7. The current sensor of claim 1, wherein the reset circuit is coupled to reset the integrator by causing a capacitor of the integrator to be shorted.

8. The current sensor of claim 1, wherein the integrator is reset when the first current is substantially zero.

9. The current sensor of claim 1, further comprising a switch that resets the integrator responsive to the reset signal.

10. The current sensor of claim 1, wherein the integrator and the reset circuit are implemented in an integrated circuit having an input terminal coupled to receive the control signal.

\* \* \* \* \*

UNITED STATES PATENT AND TRADEMARK OFFICE
Certificate

Patent No. 7,397,234 B2

Patented: July 8, 2008

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Donald E. Alfano, Round Rock, TX, (US); Timothy J. Dupuis, Austin, TX (US); and John B. Pavelka, Austin, TX (US).

Signed and Sealed this Twenty-first Day of September 2010.

Ha Nguyen
*Supervisory Patent Examiner*
Art Unit 2829
Technology Center 2800